US012751118B2

(12) United States Patent
Kim et al.

(10) Patent No.: US 12,751,118 B2
(45) Date of Patent: Sep. 29, 2026

(54) DISPLAY DEVICE

(71) Applicant: LG Display Co., Ltd., Seoul (KR)

(72) Inventors: DaBin Kim, Paju-si (KR); KyungKook Jang, Paju-si (KR); SeungBum Lee, Paju-si (KR); SeungRyong Lee, Paju-si (KR); ChaeKyung Lim, Paju-si (KR); Wonrae Kim, Paju-si (KR); Jungmin Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 817 days.

(21) Appl. No.: 18/077,418

(22) Filed: Dec. 8, 2022

(65) Prior Publication Data

US 2023/0215991 A1 Jul. 6, 2023

(30) Foreign Application Priority Data

Dec. 31, 2021 (KR) ........................ 10-2021-0194632

(51) Int. Cl.

| | |
|---|---|
| ***H10H 20/851*** | (2025.01) |
| ***H10H 29/34*** | (2025.01) |
| ***H10H 29/85*** | (2025.01) |
| ***H10H 29/851*** | (2025.01) |

(52) U.S. Cl.

CPC .... *H10H 20/8513* (2025.01); *H10H 20/8511* (2025.01); *H10H 20/8512* (2025.01); *H10H 29/34* (2025.01); *H10H 29/8511* (2025.01); *H10H 29/8512* (2025.01); *H10H 29/8517* (2025.01)

(58) Field of Classification Search

CPC ........... H10H 20/8511; H10H 20/8512; H10H 20/8513; H10H 29/8511; H10H 29/8512; H10H 29/8517; H10H 29/34

See application file for complete search history.

(56) References Cited

U.S. PATENT DOCUMENTS

| | | | | |
|---|---|---|---|---|
| 2016/0380136 | A1* | 12/2016 | Ning | H10F 77/127 252/519.4 |
| 2017/0356623 | A1 | 12/2017 | Kim et al. | |
| 2019/0036030 | A1 | 1/2019 | Wang et al. | |
| 2019/0173025 | A1 | 6/2019 | Uchida et al. | |
| 2019/0330527 | A1 | 10/2019 | Saidaminov et al. | |
| 2020/0035755 | A1 | 1/2020 | Zhou et al. | |
| 2020/0075814 | A1* | 3/2020 | Park | C09K 11/06 |
| 2020/0105838 | A1* | 4/2020 | Kim | H10K 59/878 |
| 2021/0130686 | A1 | 5/2021 | Lim | |
| 2021/0159415 | A1 | 5/2021 | Myoung et al. | |
| 2021/0273142 | A1 | 9/2021 | Kang et al. | |
| 2022/0389312 | A1 | 12/2022 | Lee et al. | |

FOREIGN PATENT DOCUMENTS

| | | | |
|---|---|---|---|
| CN | 110875348 | A | 3/2020 |
| KR | 10-2017-0139727 | A | 12/2017 |
| KR | 10-2020-0001649 | A | 1/2020 |
| KR | 10-2020-0026361 | A | 3/2020 |
| KR | 10-2020-0063256 | A | 6/2020 |
| KR | 10-2021-0014792 | A | 2/2021 |
| KR | 10-2021-0053396 | A | 5/2021 |
| KR | 10-2021-0065670 | A | 6/2021 |
| KR | 10-2021-0077587 | A | 6/2021 |
| WO | WO 2019/198159 | * | 10/2019 |
| WO | 2020/087182 | A1 | 5/2020 |
| WO | WO 2020/105087 | * | 5/2020 |

OTHER PUBLICATIONS

Korean Intellectual Property Office, Office Action, Korean Patent Application No. 10-2021-0194632, Jul. 4, 2025, 15 pages.

* cited by examiner

*Primary Examiner* — C Melissa Koslow

(74) *Attorney, Agent, or Firm* — Fenwick & West LLP

(57) ABSTRACT

The present disclosure relates to a display device, including at least one or more light sources disposed for each pixel and a light conversion layer disposed on the light source to convert a wavelength of light generated from the light source, wherein the light conversion layer includes a perovskite matrix and quantum dots.

21 Claims, 9 Drawing Sheets

DISPLAY DEVICE

CROSS-REFERENCE TO RELATED APPLICATION

This application claims the priority benefit of Republic of Korea Patent Application No. 10-2021-0194632, filed on Dec. 31, 2021, which is hereby incorporated by reference in its entirety.

BACKGROUND

Field of the Disclosure

The present disclosure relates to a display device.

Description of the Background

Display devices are being widely used as display screens of laptop computers, tablet computers, smart phones, portable display devices, portable information devices, etc. as well as display devices on televisions or monitors.

The display devices are divided into a reflective display device and a light emitting display device. Here, the reflective display device reflects natural light or light from its external lighting to display information, and the light emitting display device displays information by using light emitted from its built-in emission device or light source.

Research and development on a display device using a micro light emitting diode of micro size as an emission device has been recently conducted, and such a light emitting display device is drawing attention as a next-generation display device by virtue of its high image quality and high reliability.

SUMMARY

In a conventional display device, a light conversion layer with quantum dots converts blue light into a wavelength corresponding to red or green light by irradiating the blue light to its quantum dots. However, because a blue leakage is caused due to the low absorption rate and low external quantum efficiency of the quantum dots, it is necessary to add a color filter or increase the thickness of the light conversion layer with the quantum dots.

Accordingly, the inventors of the present disclosure have invented a display device where quantum dots are included in a perovskite matrix of a light conversion layer disposed on a light source so that the perovskite matrix absorbs blue light that cannot be absorbed by the quantum dots and transfers the light to the quantum dots to significantly reduce the blue leakage, significantly increasing the intensity of light in green and red areas, and improve a luminous efficiency.

According to embodiments of the present disclosure, there may be provided the display device where the perovskite matrix absorbs the blue light that cannot be absorbed by the quantum dots and transfers it to the quantum dots in order to significantly reduce the blue leakage.

According to embodiments of the present disclosure, there may be provided the display device capable of significantly increasing the intensity of light in the green and red areas and improving the luminous efficiency.

According to embodiments of the present disclosure, there may be provided the display device, including at least one or more light sources disposed for each pixel and the light conversion layer disposed on the light source to convert a wavelength of light from the light source, wherein the light conversion layer includes the perovskite matrix and quantum dots.

According to embodiments of the present disclosure, a display device includes a substrate, a plurality of sub-pixels on the substrate, the plurality of sub-pixels including at least a first sub-pixel including a first emission device, a second sub-pixel including a second emission device, and a third sub-pixel including a third emission device. The display device may also include a first light conversion layer disposed on the first emission device, where the first light conversion layer includes a perovskite matrix and one or more first quantum dots, the one or more first quantum dots configured to absorb light emitted from the first emission device and emit light of a first wavelength range, and a second light conversion layer disposed on the second emission device, where the second light conversion layer includes a perovskite matrix and one or more second quantum dots, the one or more second quantum dots configured to absorb light emitted from the second emission device and emit light of a second wavelength range.

According to embodiments of the present disclosure, there may be provided the display device where the perovskite matrix absorbs the blue light that cannot be absorbed by the quantum dots and transfers it to the quantum dots in order to significantly reduce the blue leakage.

According to embodiments of the present disclosure, there may be provided the display device capable of significantly increasing the intensity of light in the green and red areas and improving the luminous efficiency.

BRIEF DESCRIPTION OF THE DRAWINGS

The above and other objects, features, and advantages of the disclosure will be more clearly understood from the following detailed description, taken in conjunction with the accompanying drawings.

DETAILED DESCRIPTION

Figure 1:
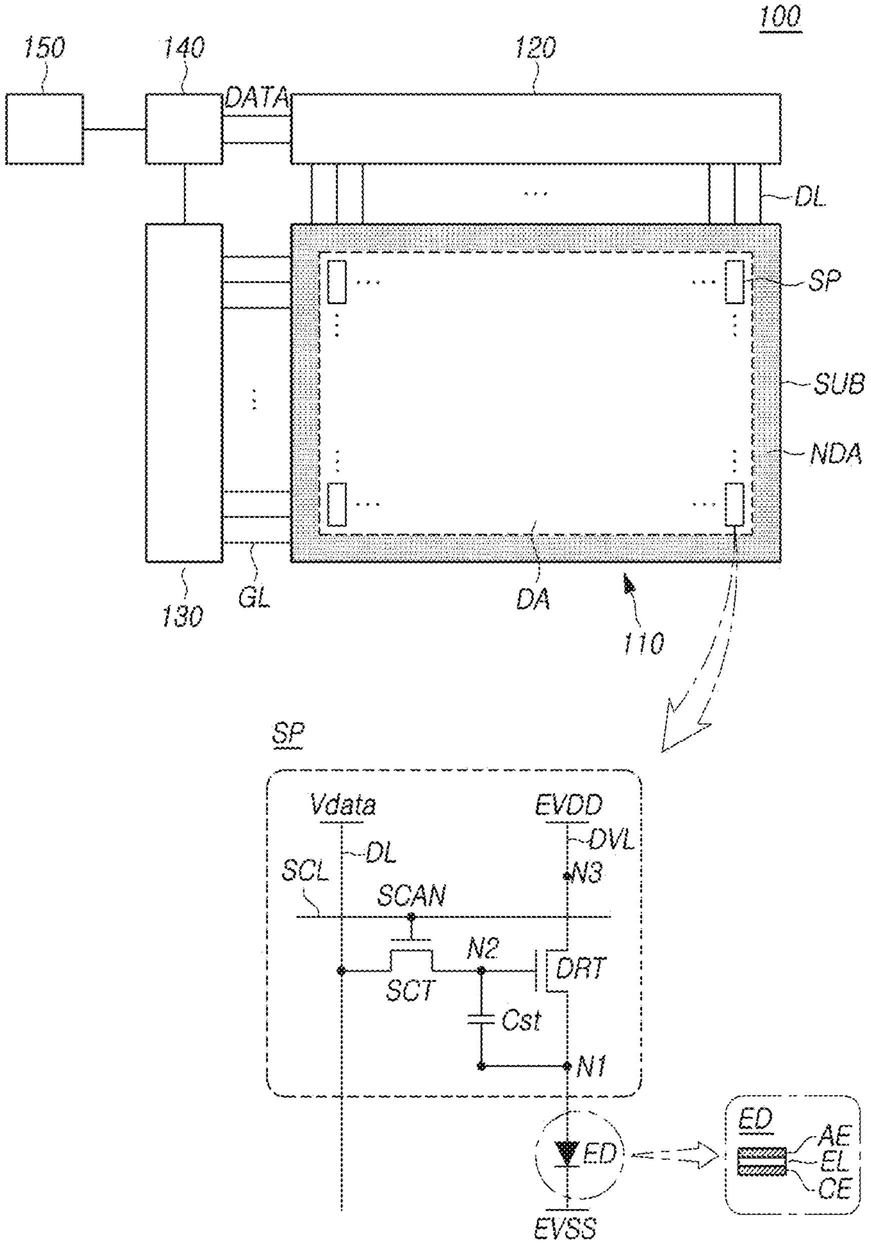
FIG. 1 is a view of a system of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the disclosure rather unclear. The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” may be used herein to describe elements of the present disclosure. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element. Here, the second element may be included in at least one of two or more elements that “are connected or coupled to”, “contact or overlap”, etc. each other.

When time relative terms, such as “after,” “subsequent to,” “next,” “before,” and the like, are used to describe processes or operations of elements or configurations, or flows or steps in operating, processing, manufacturing methods, these terms may be used to describe non-consecutive or non-sequential processes or operations unless the term “directly” or “immediately” is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term “may” fully encompasses all the meanings of the term “can”.

Hereinafter, various embodiments of the present disclosure will be described in detail with reference to the accompanying drawings.

FIG. 1 is a view of a system of a display device 100 according to embodiments of the present disclosure. Referring to FIG. 1, a display driving system of the display device 100 according to embodiments of the present disclosure may include a display panel 110 and a display driving circuit for driving the display panel 110.

The display panel 110 may include a display area DA in which an image is displayed and a non-display area NDA in which no image is displayed. The display panel 110 may include a plurality of sub-pixels SP disposed on a substrate SUB for displaying an image. The display panel 110 may include a plurality of signal lines disposed on the substrate SUB. The plurality of signal lines may include data lines DL, gate lines GL, driving voltage lines, etc.

Each of the plurality of data lines DL may be disposed to extend in a first direction (e.g., a column or row direction), and each of the plurality of gate lines GL may be disposed to extend in a direction crossing the first direction.

The display driving circuit may further include a data driving circuit 120, a gate driving circuit 130, and a controller 140 for controlling the data driving circuit 120 and the gate driving circuit 130.

The data driving circuit 120 may output data signals (also referred to as data voltages) corresponding to image signals to the plurality of data lines DL. The gate driving circuit 130 may generate and output gate signals to the plurality of gate lines GL. The controller 140 may convert input image data input from an external host 150 according to a data signal format used by the data driving circuit 120 and supply the converted image data DATA to the data driving circuit 120.

The data driving circuit 120 may include one or more source driver integrated circuits. For example, each source driver integrated circuit may be connected to the display panel 110 in a tape automated bonding (TAB) manner, may be connected to a bonding pad of the display panel 110 in a chip on glass (COG) or chip on panel (COP) manner, or may be implemented in a chip on film (COF) manner to be connected to the display panel 110.

The gate driving circuit 130 may be connected to the display panel 110 in the TAB manner, may be connected to the bonding pad of the display panel 110 in the COG or COP manner, may be connected to the display panel 110 in the COF manner, or may be formed in the non-display area NDA of the display panel 110 in a Gate In Panel (GIP) type.

Referring to FIG. 1, in the display device 100 according to embodiments of the present disclosure, each sub-pixel SP may include an emission device ED and a pixel driving circuit SPC for driving the emission device, and the pixel driving circuit SPC may include a driving transistor DRT, a scan transistor SCT, and a storage capacitor Cst.

The driving transistor DRT may drive the emission device ED by controlling a current flowing to the emission device ED. The scan transistor SCT may transfer a data voltage Vdata to a second node N2, which is a gate node of the driving transistor DRT. The storage capacitor Cst may be suitable for maintaining a voltage for a predetermined period.

The emission device ED may include an anode electrode AE, a cathode electrode CE, and an emission layer EL positioned therebetween. The anode electrode AE may be a pixel electrode involved in the formation of the emission device ED of each sub-pixel SP, and may be electrically connected to a first node N1 of the driving transistor DRT. The cathode electrode CE may be a common electrode involved in the formation of the emission device ED of all sub-pixels SP, and a base voltage EVSS may be applied thereto.

For example, the emission device ED may be an organic light emitting diode (OLED), a light emitting diode LED based on an inorganic material, an emission device made of quantum dots, which are semiconductor crystals emitting light by themselves, etc.

When the display device 100 according to embodiments of the present disclosure is an OLED display device, each sub-pixel SP may include an OLED emitting light by itself as an emission device. When the display device 100 according to embodiments of the present disclosure is a quantum dot display device, each sub-pixel SP may include the emission device made of the quantum dots, which are the semiconductor crystals emitting light by themselves. When the display device 100 according to embodiments of the present disclosure is a micro LED display device, each sub-pixel SP may include a micro LED that emits light by itself and is made from inorganic materials as its emission device. Thus, a plurality of sub-pixels SP may be disposed on a substrate and each sub-pixel SP may include emission device.

The driving transistor DRT as a transistor for driving the emission device ED may include the first node N1, the second node N2, a third node N3, etc. The first node N1 may be a source or drain node and may be electrically connected to the anode electrode AE of the emission device ED. The second node N2 may be the gate node and may be electrically connected to the source or drain node of the scan transistor SCT. The third node N3 may be the drain or source node and may be electrically connected to the driving voltage line DVL supplying a driving voltage EVDD. Hereinafter, for convenience of description, the first node N1 as the source node and the third node N3 as the drain node may be described as an example.

The scan transistor SCT may switch a connection between the data line DL and the second node N2 of the driving transistor DRT. In response to a scan signal SCAN supplied from a scan line SCL, which is a type of the gate lines GL, the scan transistor SCT may control the connection between the second node N2 of the driving transistor DRT and a corresponding data line DL among the plurality of data lines DL.

The storage capacitor Cst may be formed between the first node N1 and the second node N2 of the driving transistor DRT.

The structure of the sub-pixels SP of the present disclosure is not limited to the structure illustrated in FIG. 1, and one or more transistors or capacitors may be further included. Alternatively, each of the plurality of sub-pixels may have the same structure, or some of the plurality of sub-pixels may have a different structure. Each of the driving transistor DRT and the scan transistor SCT may be an n-type transistor or a p-type transistor.

Meanwhile, the display device 100 according to embodiments of the present disclosure may have a top emission structure or a bottom emission structure. Hereinafter, the display device 100 having the top emission structure will be described as an example. In the case of the top emission structure, the anode electrode AE may be a reflective metal, and the cathode electrode CE may be a transparent conductive layer.

Figure 2A:
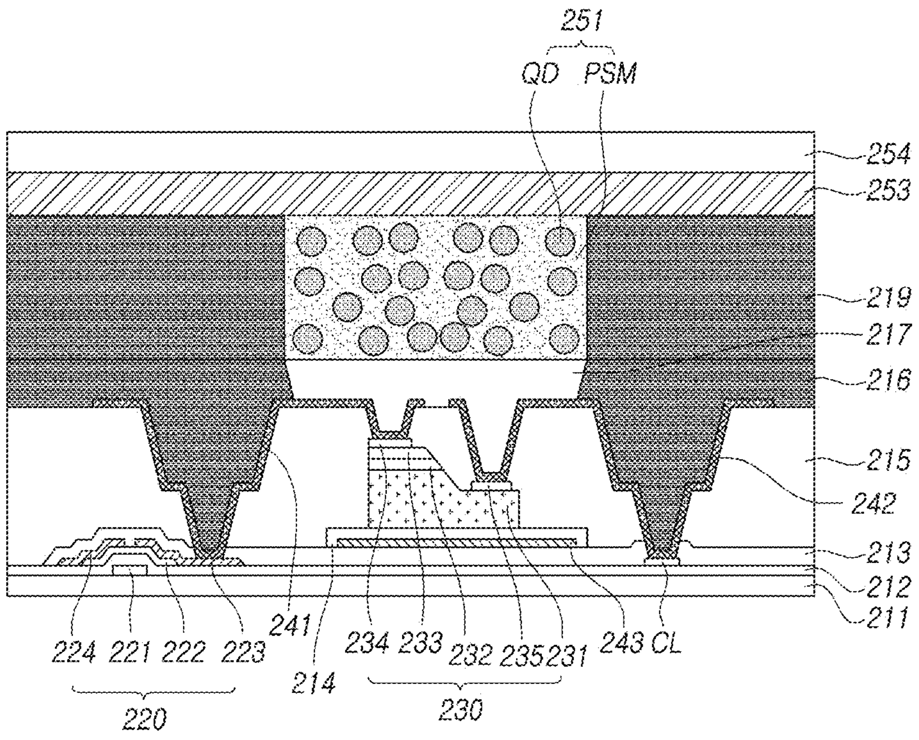
FIG. 2A is a cross-sectional view illustrating the display device according to embodiments of the present disclosure.
Figure 2B:
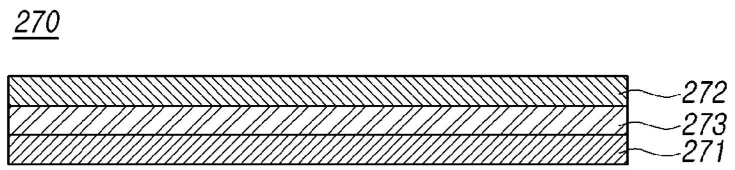
FIG. 2B is a view schematically illustrating an organic light emitting diode that can be used as a light source of the display device according to embodiments of the present disclosure.

FIG. 2A is a cross-sectional view illustrating a display device according to embodiments of the present disclosure, and FIG. 2B is a view schematically illustrating an organic light emitting diode that can be used as a light source of the display device according to embodiments of the present disclosure.

FIG. 2A shows that the display device according to embodiments of the present disclosure may have a structure where components of various functions are stacked on a substrate 211.

The substrate 211 may be a substrate to support the components and be made of an insulating material. For example, the substrate 211 may be made of glass, resin, etc. and include a polymer or plastic. In addition, the substrate 211 may be made of a plastic material having flexibility.

A thin film transistor 220 may be formed on the substrate 211. For example, a gate electrode 221 may be disposed on the substrate 211, and an active layer 222 may be disposed on the gate electrode 221. A gate insulating layer 212 for insulating the gate electrode 221 and the active layer 222 may be disposed therebetween. A source electrode 223 and a drain electrode 224 may be disposed on the active layer 222, and an interlayer insulating layer 213 for protecting the thin film transistor 220 may be disposed on the source electrode 223 and the drain electrode 224. A hole exposing a portion of the source electrode 223 of the thin film transistor 220 may be formed in the interlayer insulating layer 213, but the interlayer insulating layer 213 may be omitted depending on embodiments.

A gate line GL may be formed on the same layer as the gate electrode 221. The gate line GL may be formed of the same material as the gate electrode 221. A data line DL may be formed in the same manner as the gate line GL.

A common line CL may be disposed on the gate insulating layer 212. The common line CL may be a line for applying a common voltage to the light source 230 and be disposed to be spaced apart from the gate line GL or the data line DL. Furthermore, the common line CL may extend in the same direction as the gate line GL or the data line DL. The common line CL may be made of the same material as the source electrode 223 and the drain electrode 224, but is not limited thereto. For example, the common line CL may be made of the same material as the gate electrode 221. The interlayer insulating layer 213 may be formed on the common line CL, but a hole exposing a portion of the common line CL may be formed in the interlayer insulating layer 213.

A reflective layer 243 may be disposed on the interlayer insulating layer 213. The reflective layer 243 may be a layer for reflecting light emitted toward the substrate 211 among light emitted from the light source 230 to an upper portion of the display device 100 so as to emit the light to the outside of the display device 100. The reflective layer 243 may be made of a metal material having high reflectivity.

An adhesive layer 214 may be disposed on the reflective layer 243. The adhesive layer 214 may be a layer for bonding the light source 230 on the reflective layer 243 and may insulate the reflective layer 243 made of the metal material and the light source 230. The adhesive layer 214 may be formed of a heat-curable material or a light-curable material, but is not limited thereto.

The light source 230 may be disposed on the adhesive layer 214 to overlap the reflective layer 243. The light source 230 may be the organic light emitting diode (OLED) or a light emitting diode (LED) based on an inorganic material. The light source 230 may emit light of a white wavelength band or, in some cases, light of a specific wavelength band such as a blue wavelength band.

When the LED based on an inorganic material is used as the light source 230, the LED 230 may include an n-type layer 231, an active layer 232, a p-type layer 233, an n-electrode 235, and a p-electrode 234. Hereinafter, the LED 230 having a lateral structure is described as an example, but the structure of the LED 230 is not limited thereto. For example, the LED 230 may also have a vertical or flip shape. The LED 230 may be of a micro size, i.e., a chip size of 100 μm or less or of a mini size, i.e., a chip size of several hundred μm.

An exemplary stacked structure of the LED 230 is as follows. The n-type layer 231 may be formed by implanting n-type impurities into gallium nitride (GaN). The active layer 232 may be disposed on the n-type layer 231. The active layer 232 may be an emission layer emitting light from the LED 230 and be made of a nitride semiconductor such as indium gallium nitride (InGaN). The p-type layer 233 may be disposed on the active layer 232. The p-type layer 233 may be formed by implanting p-type impurities into gallium nitride (GaN). However, the materials of the n-type layer 231, the active layer 232, and the p-type layer 233 are not limited thereto.

As described above, the LED 230 may be produced by sequentially stacking the n-type layer 231, the active layer 232, and the p-type layer 233 and etching a predetermined portion to form the n-electrode 235 and the p-electrode 234. In this case, the predetermined portion may be a space for separating the n-electrode 235 and the p-electrode 234 and may be etched to expose a portion of the n-type layer 231. In other words, the surface of the LED 230 on which the n-electrode 235 and the p-electrode 234 are to be disposed may not be a planarized surface but have different height levels.

As such, the n-electrode 235 may be disposed on the exposed n-type layer 231. The n-electrode 235 may be made of a conductive material, e.g., a transparent conductive oxide. Meanwhile, the p-electrode 234 may be disposed on a non-etched area, i.e., the p-type layer 233. The p-electrode 234 may also be made of a conductive material, e.g., a transparent conductive oxide. In addition, the p-electrode 234 may be made of the same material as the n-electrode 235.

When the n-type layer 231, the active layer 232, the p-type layer 233, the n-electrode 235, and the p-electrode 234 are formed as described above, the LED 230 may be disposed for the n-type layer 231 to be more adjacent to the reflective layer 243 than to the n-electrode 235 and the p-electrode 234.

A planarization layer 215 may be located on the upper surface of the substrate 211. The planarization layer 215 may planarize an upper portion of the thin film transistor 220. The planarization layer 215 may planarize the upper portion of the thin film transistor in an area other than a contact hole and an area where the LED 230 is disposed. The planarization layer 215 may be formed to keep a portion of the p-electrode 234 and the n-electrode 235 of the LED 230 open. Meanwhile, the planarization layer 215 may include a single layer or two or more layers.

The planarization layer 215 may serve to fix the position of the LED (230). That is, while the planarization layer 215 is formed after the LED 230 is positioned, it may be completely in close contact with the LED 230. Unlike the conventional method in which an accommodating space such as a cup or a hole is provided in the planarization layer 215 and then the LED is transferred thereto, the LED may be more firmly held in place in the structure where the planarization layer is stacked after the LED is positioned.

In addition, the planarization layer 215 may facilitate a connection between the source electrode 223 and the p-electrode 234. As shown in FIG. 2A, a first connection electrode 241 may be connected with a gentle slope through the planarization layer 215 between the source electrode 223 and the p-electrode 234. Without the planarization layer, since the source electrode 223 and the p-electrode 234 are connected to each other through a steep sidewall of the LED, the possibility of disconnection of the first connection electrode 241 may be increased. Accordingly, by the planarization layer 215, the connection stability between the source electrode 223 and the p-electrode 234 may be increased. The planarization layer may have the same functional value in the connection between the common line CL and the n-electrode 235.

The first connection electrode 241 may connect the thin film transistor 220 and the p-electrode 234 of the LED 230. The first connection electrode 241 may be in contact with the source electrode 223 of the thin film transistor 220 through a contact hole formed in the planarization layer 215, the interlayer insulating layer 213, and the adhesive layer 214, and may be in contact with the p-electrode 234 of the LED 230 through the contact hole in the planarization layer 215. However, the present disclosure is not limited thereto, and the first connection electrode 241 may also be defined to be in contact with the drain electrode 224 of the thin film transistor 220 depending on the type of the thin film transistor 220. The first connection electrode 241 may be defined as an anode electrode.

A second connection electrode 242 may connect the common line CL and the n-electrode 235 of the LED 230. The second connection electrode 242 may be in contact with the common line CL through the contact hole formed in the planarization layer 215, the interlayer insulating layer 213, and the adhesive layer 214, and may be in contact with the n-electrode 235 of the LED 230 through the contact hole formed in the planarization layer 215. The second connection electrode 242 may be defined as a cathode electrode.

Accordingly, when the display device is turned on, different voltage levels applied to each of the source electrode 223 of the thin film transistor 220 and the common line CL may be transmitted to the p-electrode 234 and the n-electrode 235 through the first connection electrode 241 and the second connection electrode 242 so that LED 230 may be capable of emitting light. FIG. 2A shows that the thin film transistor 220 may be electrically connected to the p-electrode 234 and the common line CL may be electrically connected to the n-electrode 235, but the present disclosure is not limited thereto. For example, the thin film transistor 220 may be electrically connected to the n-electrode 235, and the common line CL may be electrically connected to the p-electrode 234.

Banks 216 and 219 may be formed on the planarization layer 215 as an insulating layer defining an emission area. The bank may include a plurality of layers of a first bank 216 and a second bank 219. The banks 216 and 219 may be formed of an organic insulating material. In addition, the banks 216 and 219 may be capable of including a black material to absorb light for preventing the light emitted from the LED 230 from being transmitted to an adjacent sub-pixel and causing color mixing.

A protective layer 217 may protect the LED 230 and provide a function of diffusing the light emitted from the LED 230. The protective layer 217 may be formed on the bank 216, a first connection line 241, the planarization layer 215, and a second connection line 242 in an area where the LED 230 is positioned. The protective layer 217 may be made of a polyacrylic material, which is a transparent organic material.

A light conversion layer 251 may be formed on the protective layer 217 and provide a function of increasing the color reproducibility of light generated by the LED 230. The light conversion layer 251 according to embodiments of the present disclosure may be disposed to correspond to sub-pixels, or may be omitted.

For example, when the LED 230 emits white light, the light conversion layer for converting white to red may be disposed in a red sub-pixel, the light conversion layer for converting white to green may be disposed in a green sub-pixel, and the light conversion layer for converting white to blue may be disposed in a blue sub-pixel. Furthermore, when the LED 230 emits blue light, the light conversion layer for converting blue to red may be disposed in the red sub-pixel and the light conversion layer for converting blue to green may be disposed in the green sub-pixel, but no light conversion layer may be disposed in the blue sub-pixel.

Thus, for example, the sub-pixels SP may include a first sub-pixel including a first emission device, a second sub-pixel including a second emission device, and a third sub-pixel including a third emission device. A first light conversion layer 251 may be disposed on the first emission device (e.g., emitting white or blue light), and the first light conversion layer 251 may include a perovskite matrix and one or more first quantum dots bound to the perovskite matrix. The one or more first quantum dots may be configured to absorb light emitted from the first emission device and emit light of a first wavelength range (e.g., by determining size, shape, material, bandgap of QD's to emit the first wavelength range). For example, the first wavelength range may correspond to green light. A second light conversion layer 251 may be disposed on the second emission device, and the second light conversion layer 251 may include a perovskite matrix and one or more second quantum dots bound to the perovskite matrix. The one or more second quantum dots may be configured to absorb light emitted from the second emission device and emit light of a second wavelength range (e.g., by determining size, shape, material, bandgap of QD's to emit the second wavelength range). For example, the second wavelength range may correspond to red light. Optionally, a third light conversion layer 251 may be disposed on the third emission device, and the third light conversion layer 251 may include a perovskite matrix and one or more third quantum dots bound to the perovskite matrix. The one or more third quantum dots may be configured to absorb light emitted from the third emission device and emit light of a blue wavelength range (e.g., by determining size, shape, material, bandgap of QD's to emit the third wavelength range). For example, the third wavelength range may correspond to blue light.

In the display device according to embodiments of the present disclosure, the light conversion layer 251 may be formed to include a perovskite matrix PSM and quantum dots QD, which will be described in detail below.

A color filter 253 may be formed on the light conversion layer 251 to provide a function of increasing the color reproducibility of light passing through the light conversion layer 251. The color filter 253 may be disposed to correspond to the sub-pixels, or may be omitted. For example, when the LED 230 emits white light, a red color filter may be disposed in the red sub-pixel, a green color filter may be disposed in the green sub-pixel, and a blue color filter may be disposed in the blue sub-pixel. Furthermore, when the LED 230 emits blue light, the red color filter may be disposed in the red sub-pixel and the green color filter may be disposed in the green sub-pixel, but no color filter may be disposed in the blue sub-pixel.

A second substrate 254 may be formed on the color filter 253 and be a glass substrate, or an encapsulation or protective film.

In the display device described above, the LED 230 may be used as the light source, but the present disclosure is not limited thereto. For example, the organic light emitting diode (OLED) may be used as the light source.

Referring to FIG. 2B, the OLED 270 used as the light source 230 may include a first electrode 271, a second electrode 272, and an organic material layer 273 positioned between the first electrode 271 and the second electrode 272.

For example, the first electrode 271 may be the anode electrode and the second electrode 272 may be the cathode electrode.

For example, the first electrode 271 may be a transparent electrode, and the second electrode 272 may be a reflective electrode. In another embodiment, the first electrode 271 may be the reflective electrode, and the second electrode 272 may be the transparent electrode.

The organic material layer 273 may be a layer that is positioned between the first electrode 271 and the second electrode 272 and includes an organic material, and may include a plurality of layers.

The organic layer 273 may have a multi-layered structure made of different materials to increase the efficiency and stability of the OLED 270, and may include an emission layer. In addition, the organic material layer 273 may further include at least one of a hole injection layer, a hole transport layer, an electron transport layer, and an electron injection layer.

For example, the organic material layer 273 may include the hole injection layer positioned on the first electrode 271, the hole transport layer positioned on the hole injection layer, the emission layer positioned on the hole transport layer, the electron transport layer positioned on the emission layer, and the electron injection layer positioned on the electron transport layer. In this embodiment, the first electrode 271 may be the anode electrode, and the second electrode 272 may be the cathode electrode.

The emission layer may be a layer in which light is emitted when holes and electrons transferred from the first electrode 271 and the second electrode 272 meet. For example, the emission layer may include a host material and a dopant.

The first electrode 271 and the second electrode 272 in FIG. 2B may be respectively connected to the first connection electrode 241 and the second connection electrode 242 in FIG. 2A.

Figure 3:
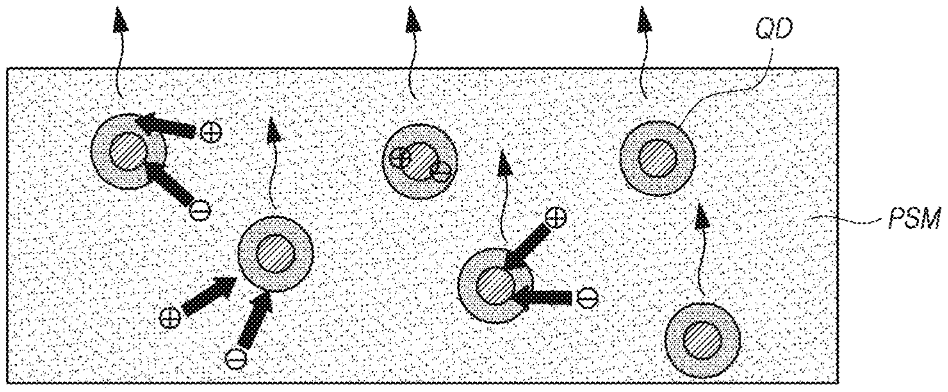
FIG. 3 is a view schematically illustrating a light conversion layer of the display device according to embodiments of the present disclosure.
Figure 4:
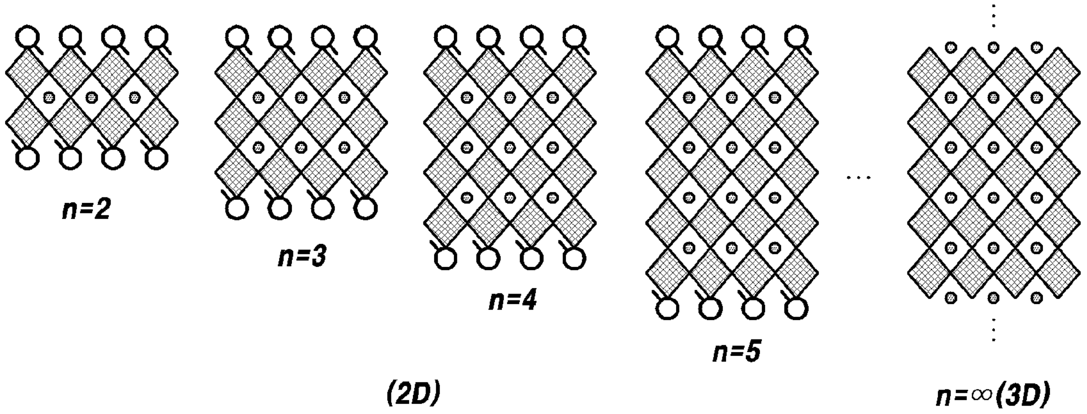
FIG. 4 is a view of a 2D structure of a perovskite matrix according to embodiments of the present disclosure.

FIG. 3 is a view schematically illustrating a light conversion layer of a display device according to embodiments of the present disclosure, and FIG. 4 is a view of a 2D structure of a perovskite matrix according to embodiments of the present disclosure.

In general, the light conversion layer with the quantum dots converts blue light into a wavelength corresponding to red or green light by irradiating the blue light to the quantum dots. However, because a blue leakage is caused due to the low absorption rate and low external quantum efficiency of the quantum dots, it is necessary to add a color filter or increase the thickness of the light conversion layer with the quantum dots.

Referring to FIG. 3, in the display device according to embodiments of the present disclosure, the light conversion layer 251 may be formed to include the perovskite matrix PSM and the quantum dots QD.

Since the perovskite matrix PSM may absorb blue light that the quantum dots QD cannot absorb and transfer the light to the quantum dots QD in the form of charges, the light conversion layer 251 may be capable of reducing the blue leakage and improving an external quantum efficiency.

The light conversion layer 251 may include the perovskite matrix and the quantum dots in weight ratios of 10:90 to 50:50, 20:80 to 50:50, and 30:70 to 50:50.

When the perovskite matrix and quantum dots are included in the above-mentioned range, the perovskite matrix PSM may be capable of absorbing the blue light that the quantum dots QD cannot absorb and transferring the light to the quantum dots QD in the form of charges, thereby reducing the blue leakage and improving the external quantum efficiency.

Referring to FIG. 4, a 2D structure is formed by adding a large organic spacer to a conventional perovskite. In addition, when a bandgap Eg is increased due to the quantum confinement effect, a 3D structure and the 2D structure are mixed in such a perovskite to form multi bandgaps.

In the display device according to embodiments of the present disclosure, the perovskite matrix included in the light conversion layer 251 is represented by Chemical Formula 1.

$A_{n-1}B_2M_nX_{3n+1}$ [Chemical Formula 1]

In Chemical Formula 1, A is an organic ammonium ion serving as a spacer, B is a cation, M is a metal cation, X is a halogen anion and n is an integer of 2 or more.

A may be selected from the group consisting of phenyl ammonium (PA), phenyl methyl ammonium (PMA), dimethyl phenyl ammonium (DPA), phenyl trimethyl ammonium (PTA), benzyl ammonium (BA), and combinations thereof.

In Chemical Formula 1, B may be a monovalent cation. It may be selected from the group consisting of $C_xH_{2x+1}NH_3^+$, $HC(NH_2)_2^+$, $K^+$, $Rb^+$, $Cs^+$, and combinations thereof, and may be $CH_3NH_3^+$ (methyl ammonium ($MA^+$)), HC $(NH_2)_2$+(form amidinium(FA)), $Rb^+$, and $Cs^+$.

Here, x may be represented by an integer of 1 to 9.

In Chemical Formula 1, M is a metal cation. It may be selected from the group consisting of $Pb^{2+}$, $Sn^{2+}$, $Ge^{2+}$, and combinations thereof, and may be $Sn^{2+}$ or $Ge^{2+}$.

In Chemical Formula 1, X may be a halogen anion selected from the group consisting of $Cl^-$, $Br^-$, $I^-$, and combinations thereof.

In the display device according to embodiments of the present disclosure, the quantum dots included in the light conversion layer 251 may be located or bound into the perovskite matrix, but it is not limited thereto. the ratio of the lattice constant of the perovskite matrix PSM and the quantum dots QD included in the light conversion layer 251 may be in the range of −3% to 3% or −2% to 2%.

When the lattice constant of the perovskite matrix PSM is a and the lattice constant of the quantum dots is b, the ratio of the lattice constant may be determined by the following equation.

$$\text{Ratio of lattice constant} = \frac{a-b}{a} \times 100$$

When the ratio of the lattice constant of the perovskite matrix PSM and the quantum dots QD is in the above-mentioned range, since the lattice stress is low, it may be possible to reduce or minimize a lattice mismatch at an interface between the perovskite matrix PSM and the quantum dots QD to prevent reduction in photostability and quantum efficiency. That is, it may possible that a charge transfer from the perovskite matrix PSM to the quantum dots QD occurs efficiently by reducing or minimizing the loss of a photocarrier. That is, it may be possible that the charges are efficiently transferred from the perovskite matrix PSM to the quantum dots QD by reducing or minimizing the loss of the photocarrier.

In the display device according to embodiments of the present disclosure, the quantum dots QD included in the light conversion layer 251 may be converted into halogen ligands to be dispersed in polar solvents. Since the halogen ligands may be short in length, they may be capable of transferring charges and may be easily dispersed in polar solvents.

The quantum dots QD may be selected from the group consisting of a group II-VI compound, a group III-V compound, a group IV-VI compound, a group IV element, a group IV compound, and combinations thereof.

The group II-VI compound may be selected from the group consisting of a diatomic compound, a ternary compound, and a quaternary compound. The diatomic compound may be selected from the group consisting of CdSe, CdTe, ZnS, ZnSe, ZnTe, ZnO, HgS, HgSe, HgTe, MgSe, MgS, and mixtures thereof. The ternary compound may be selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof. The quaternary compound may be selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The group III-V compound may be selected from the group consisting of a diatomic compound, a ternary compound, and a quaternary compound. The diatomic compound may be selected from the group consisting of GaN, GaP, GaAs, GaSb, AlN, AlP, AlAs, AlSb, InN, InP, InAs, InSb, and mixtures thereof. The ternary compound may be selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof. The quaternary compound may be selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI compound may be selected from the group consisting of a diatomic compound, a ternary compound, and a quaternary compound. The diatomic compound may be selected from the group consisting of SnS, SnSe, SnTe, PbS, PbSe, PbTe, and mixtures thereof. The ternary compound may be selected from the group consisting of SnSeS, SnSeTe, SnSTe, PbSeS, PbSeTe, PbSTe, SnPbS, SnPbSe, SnPbTe, and mixtures thereof. The quaternary compound may be selected from the group consisting of SnPbSSe, SnPbSeTe, SnPbSTe, and mixtures thereof.

The group IV element may be selected from the group consisting of Si, Ge, and mixtures thereof.

The group IV compound may be a diatomic compound selected from the group consisting of SiC, SiGe, and mixtures thereof.

Here, the diatomic compound, the ternary compound, and the quaternary compound may be present in particles at a uniform concentration, or may be present in the same particle with partially different concentration distribution. They may also have a core-shell structure in which one quantum dot surrounds another. The core and the shell may be made of different compounds.

An interface between a core and a shell may have a concentration gradient in which concentrations of elements present in the shell decrease toward the center.

In the display device according to embodiments of the present disclosure, the light conversion layer 251 may further include a fluorescent dye.

The fluorescent dye may be a red fluorescent dye, a green fluorescent dye, a dye emitting light of other colors, combinations thereof, etc.

Figure 5:
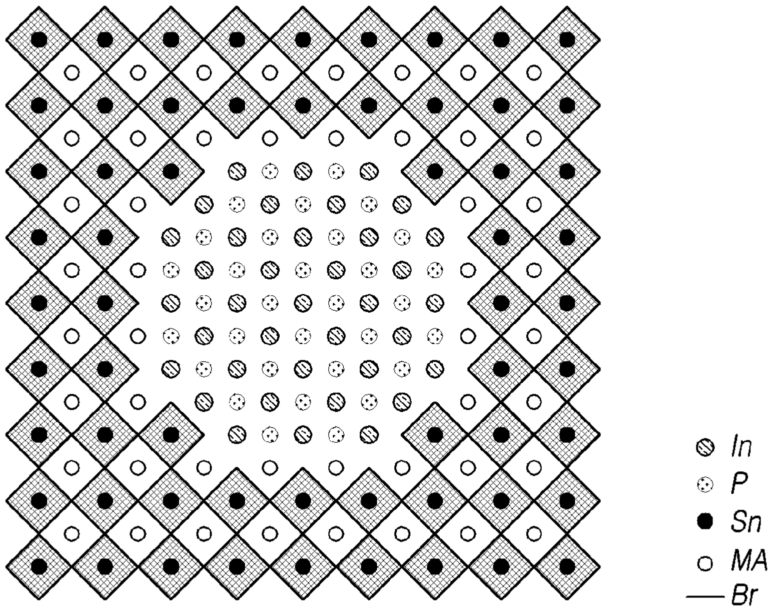
FIG. 5 is a view illustrating a structure of the perovskite matrix and quantum dots according to embodiments of the present disclosure.
Figure 6:
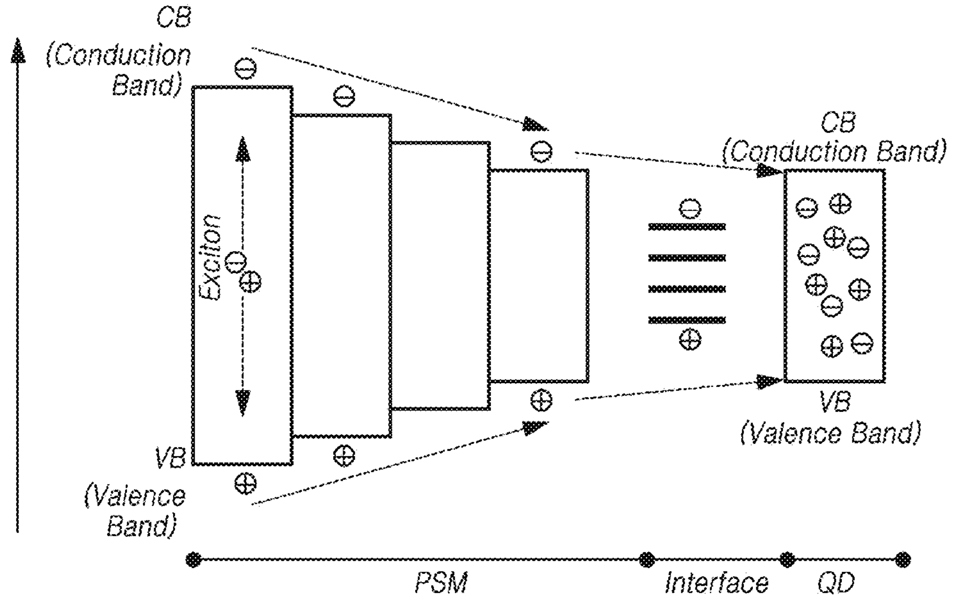
FIG. 6 is a view illustrating a band gap between the perovskite matrix and the quantum dots according to embodiments of the present disclosure.

FIG. 5 is a view illustrating a structure of the perovskite matrix and the quantum dots according to embodiments of the present disclosure, and FIG. 6 is a view illustrating a band gap between the perovskite matrix and the quantum dots according to embodiments of the present disclosure.

Referring to FIG. 5, the quantum dots QDs may be bound into the perovskite matrix PSM when $A_2MA_2Sn_3Br_{10}$ is used as the perovskite matrix PSM and InP is used as the quantum dots QD.

Referring to FIG. 6, the perovskite matrix PSM may be capable of efficiently transferring the charges to the quantum dots QD by forming the multi bandgaps (VB, CB). In other words, the perovskite matrix PSM may form the multi bandgaps (VB, CB) to transfer the charges to the quantum dots QD, thereby being capable of increasing a charge concentration in the quantum dots QD to reduce the blue leakage and improve the external quantum efficiency.

Figure 7:
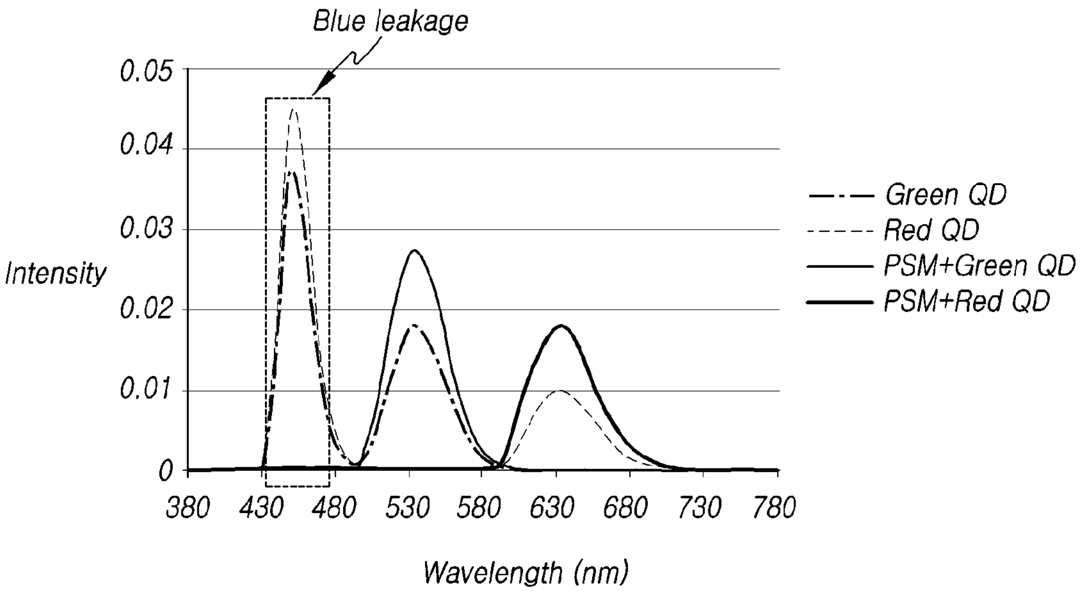
FIG. 7 is a view of an absorption spectrum to which the light conversion layer according to embodiments of the present disclosure has been applied.
Figure 8:
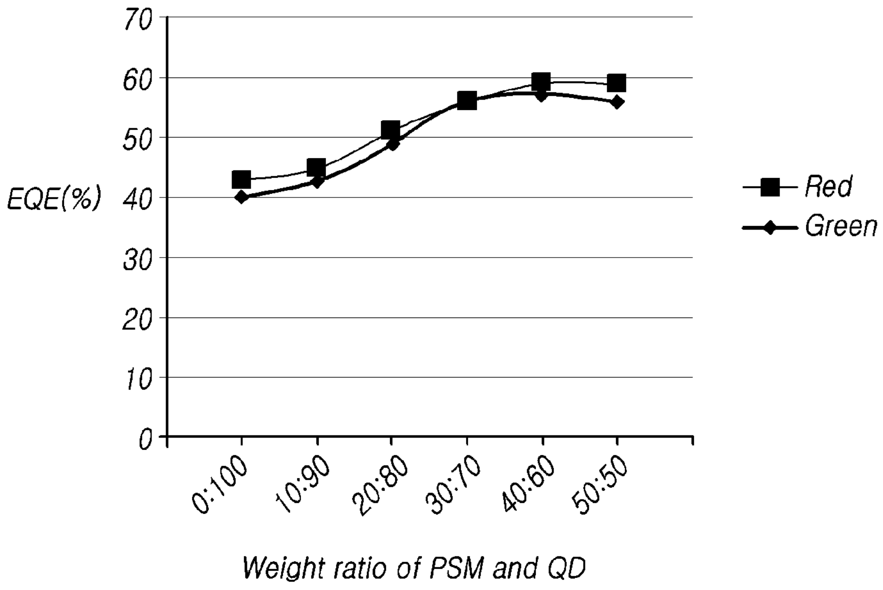
FIG. 8 is a view of a graph showing an external quantum efficiency to which the light conversion layer according to embodiments of the present disclosure has been applied.

FIG. 7 is a view of an absorption spectrum to which a light conversion layer 251 according to embodiments of the present disclosure has been applied, and FIG. 8 is a view of a graph showing an external quantum efficiency to which the light conversion layer 251 according to embodiments of the present disclosure has been applied.

FIGS. 7 and 8 show that, in the light conversion layer 251 according to embodiments of the present disclosure, a blue leakage is significantly reduced compared to the conventional light conversion layer including only quantum dots QD.

According to FIG. 7, blue light not absorbed by the quantum dots is leaked in the light conversion layer including only green or red quantum dots, while a perovskite matrix absorbs the blue light not absorbed by the quantum dots to transfer the light to the quantum dots in the light conversion layer according to embodiments of the present disclosure so that the blue leakage is significantly reduced and the intensity of light in green and red areas is significantly increased.

According to FIG. 8, in the light conversion layer not including the perovskite matrix, a red pixel has an external quantum efficiency EQE of approximately 43% and a green pixel has an external quantum efficiency EQE of approximately 40%, while the red pixel has an external quantum efficiency EQE of up to 59% and the green pixel has an external quantum efficiency EQE of up to 57% in the light conversion layer according to embodiments of the present disclosure including the perovskite matrix in the range of 10 to 50% by weight.

According to embodiments of the present disclosure, there may be provided the display device where the quantum dots may be included in the perovskite matrix of the light conversion layer disposed on the light source so that the perovskite matrix may absorb the blue light that cannot be absorbed by the quantum dots and transfer the light to the quantum dots to significantly reduce the blue leakage, significantly increase the intensity of light in the green and red areas, and improve the external quantum efficiency.

The description above has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The description above and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:

at least one or more light sources disposed for each pixel; and a light conversion layer disposed on a light source to convert a wavelength of light from the light source, wherein the light conversion layer comprises a perovskite matrix and quantum dots, and wherein the perovskite matrix comprises a perovskite including an organic ammonium ion serving as a spacer, wherein the perovskite matrix is represented by Chemical Formula 1:

$$A_{n-1}B_2M_nX_{3n+1}, \quad \text{[Chemical Formula 1]}$$

where A is the organic ammonium ion, B is a cation, M is a metal cation, X is a halogen anion and n is an integer of 2 or more.

2. The display device of claim 1, wherein the light conversion layer comprises the perovskite matrix and the quantum dots in a weight ratio of 10:90 to 50:50.

3. The display device of claim 1, wherein A is the organic ammonium ion selected from the group consisting of phenyl ammonium (PA), phenyl methyl ammonium (PMA), dimethyl phenyl ammonium (DPA), phenyl trimethyl ammonium (PTA), benzyl ammonium (BA), and combinations thereof.

4. The display device of claim 1, wherein B is the cation selected from the group consisting of $C_xH_{2x+1}NH_3^+$, $HC(NH_2)_2^+$, $K^+$, $Rb^+$, $Cs^+$ and combinations thereof and x is an integer from 1 to 9.

5. The display device of claim 1, wherein M is the metal cation selected from the group consisting of $Pb^{2+}$, $Sn^{2+}$, $Ge^{2+}$, and combinations thereof.

6. The display device of claim 1, wherein X is the halogen anion selected from the group consisting of $Cl^-$, $Br^-$, $I^-$, and combinations thereof.

7. The display device of claim 1, wherein a ratio of a lattice constant of the perovskite matrix and a lattice constant for the quantum dots is in the range of −3% to 3%.

8. The display device of claim 1, wherein the quantum dots are selected from the group consisting of a group II-VI compound, a group III-V compound, a group IV-VI compound, a group IV element, a group IV compound, and combinations thereof.

9. The display device of claim 7, wherein the quantum dots have a core-shell structure including a core and a shell, and the core and the shell are made of different compounds.

10. The display device of claim 1, wherein the light conversion layer further comprises a fluorescent dye.

11. The display device of claim 1, further comprising a color filter on the light conversion layer.

12. The display device of claim 1, wherein the quantum dots are bound into the perovskite matrix.

13. A display device, comprising:

a substrate;

a plurality of sub-pixels on the substrate, the plurality of sub-pixels including at least a first sub-pixel including a first emission device, a second sub-pixel including a second emission device, and a third sub-pixel including a third emission device;

a first light conversion layer disposed on the first emission device, wherein the first light conversion layer comprises a perovskite matrix and one or more first quantum dots, the one or more first quantum dots configured to absorb light emitted from the first emission device and emit light of a first wavelength; and a second light conversion layer disposed on the second emission device, wherein the second light conversion layer comprises a perovskite matrix and one or more second quantum dots, the one or more second quantum dots configured to absorb light emitted from the second emission device and emit light of a second wavelength, wherein the perovskite matrix comprises a perovskite including an organic ammonium ion serving as a spacer, wherein the perovskite matrix is represented by Chemical Formula 1:

$A_{n-1}B_2M_nX_{3n+1}$, [Chemical Formula 1]

where A is the organic ammonium ion, B is a cation, M is a metal cation, X is a halogen anion and n is an integer of 2 or more.

14. The display device of claim 13, wherein the first emission device, the second emission device, and the third emission device are micro light-emitting diode (LED) devices.

15. The display device of claim 13, wherein the light of the first wavelength range is green light and the light of the second wavelength range is red light.

16. The display device of claim 13, wherein the third emission device emits blue light and the third sub-pixel is not formed with a light conversion layer.

17. The display device of claim 13, wherein A is selected from the group consisting of phenyl ammonium (PA), phenyl methyl ammonium (PMA), dimethyl phenyl ammonium (DPA), phenyl trimethyl ammonium (PTA), benzyl ammonium (BA), and combinations thereof.

18. The display device of claim 13, wherein B is selected from the group consisting of $C_xH_{2x+1}NH_3^+$, $HC(NH_2)_2^+$, $K^+$, $Rb^+$, $Cs^+$, and combinations thereof, wherein x is an integer from 1 to 9.

19. The display device of claim 13, wherein X is selected from the group consisting of $Cl^-$, $Br^-$, $I^-$, and combinations thereof.

20. The display device of claim 13, wherein the quantum dots are selected from one or a combination of a group II-VI compound, a group III-V compound, a group IV-VI compound, a group IV element, and a group IV compound.

21. The display device of claim 13, further comprising a first color filter on the first light conversion layer and a second color filter on the second light conversion layer.

* * * * *